United States Patent
Dittrich

(10) Patent No.: US 7,719,884 B2
(45) Date of Patent: May 18, 2010

(54) INTEGRATED CIRCUIT, CELL ARRANGEMENT, METHOD OF MANUFACTURING AN INTEGRATED CIRCUIT, METHOD OF OPERATING AN INTEGRATED CIRCUIT, AND MEMORY MODULE

(75) Inventor: Rok Dittrich, Brussels (BE)

(73) Assignees: Qimonda AG, Munich (DE); ALTIS Semiconductor, SNC, Corbeil Essonnes Cedex (FR)

( * ) Notice: Subject to any disclaimer, the term of this patent is extended or adjusted under 35 U.S.C. 154(b) by 173 days.

(21) Appl. No.: 12/123,286

(22) Filed: May 19, 2008

(65) Prior Publication Data
US 2009/0285012 A1   Nov. 19, 2009

(51) Int. Cl.
*G11C 11/00*   (2006.01)
(52) U.S. Cl. .................... 365/158; 365/210.1
(58) Field of Classification Search ........... 365/210.11
See application file for complete search history.

(56) References Cited

U.S. PATENT DOCUMENTS 6,590,804 B1 *  7/2003  Perner ........................ 365/158
6,791,865 B2 *  9/2004  Tran et al. ................... 365/158

OTHER PUBLICATIONS

Honigschmid, H., et al., "Signal-Margin-Screening for Multi-Mb MRAM," 2006 IEEE International Solid State Circuits Conference, Digest of Technical Papers, ISSCC 2006, Session 7, Feb. 6-9, 2006, 10 pages, IEEE.
"Spintronics," http://www.research.ibm.com/journal/rd50-1.html, IBM Journal of Research and Development vol. 50, No. 1, 2006, 2 pages.

* cited by examiner

*Primary Examiner*—Tan T. Nguyen
(74) *Attorney, Agent, or Firm*—Slater & Matsil, L.L.P.

(57) ABSTRACT

According to one embodiment of the present invention, and integrated circuit having a cell arrangement is provided. The cell arrangement includes: at least one reference memory cell set to a reference memory cell state; and a bias supplier to supply a bias condition to the reference memory cell when accessing the memory cell, such that the bias condition increases the stability of the set reference memory cell state.

24 Claims, 3 Drawing Sheets

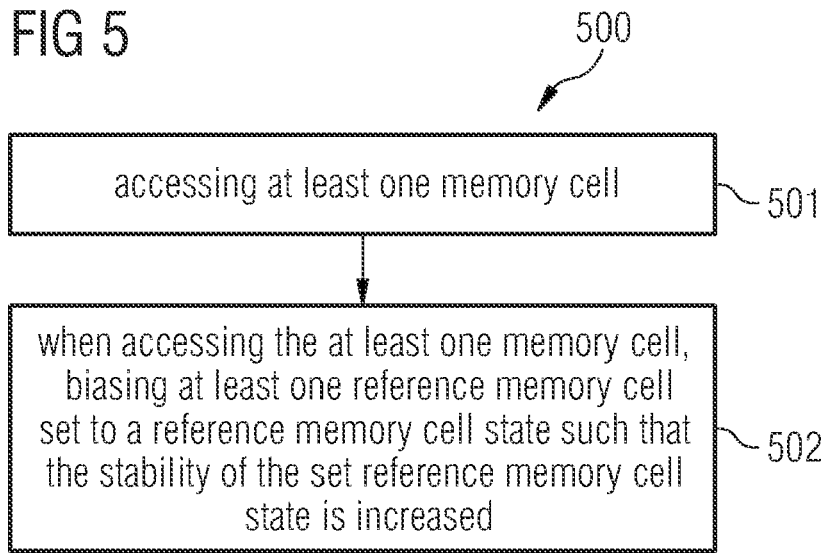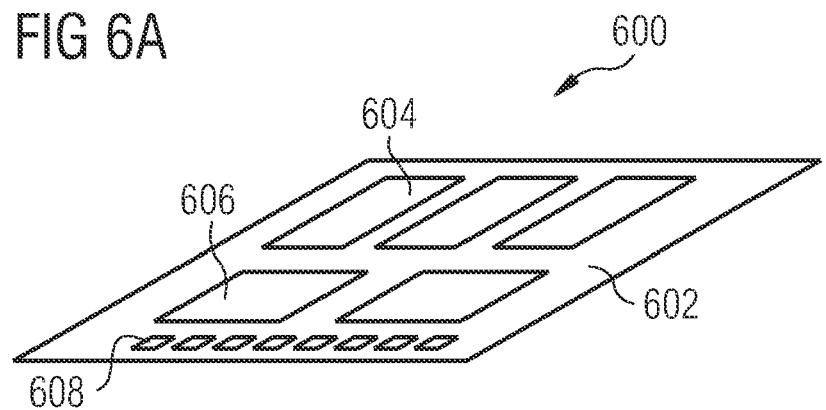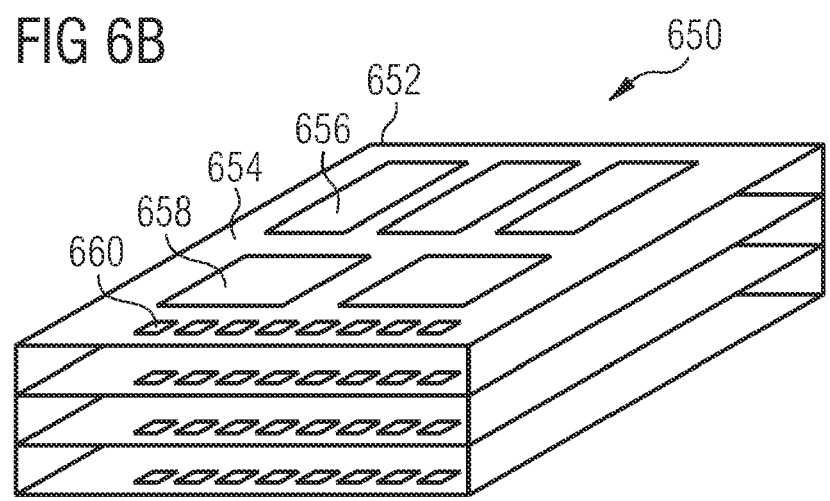

INTEGRATED CIRCUIT, CELL ARRANGEMENT, METHOD OF MANUFACTURING AN INTEGRATED CIRCUIT, METHOD OF OPERATING AN INTEGRATED CIRCUIT, AND MEMORY MODULE

TECHNICAL FIELD

Integrated circuits including magneto-resistive memory cells are known. Magneto-resistive memory cells involve spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can also partially turn the magnetic polarity. Digital information, represented as a "0" or "1" is stored in the alignment of magnetic moments. The resistance of the magnetic component depends on the moment's alignment. The stored state is read from the element by detecting the component's resistive state. A memory cell may be constructed by placing the conductive lines and cross-points in a matrix structure or array having rows and columns.

FIG. 1 illustrates a perspective view of a MRAM device 110 having bit lines 112 located orthogonal to word lines 114 in adjacent metallization layers. Magnetic stacks 116 are positioned between the bit lines 112 and word lines 114 adjacent and electrically coupled to bit lines 112 and word lines 114. Magnetic stacks 116 preferably include multiple layers, including a soft layer 118, a tunnel layer 120, and a hard layer 122, for example. Soft layer 118 and hard layer 122 preferably include a plurality of magnetic metal layers, for example, eight to twelve layers of materials such as PtMn, CoFe, Ru, and NiFe, as examples. A logic state is storable in the soft layer 118 of the magnetic stacks 116 located at the junction of the bitlines 112 and word lines 114 by running a current in the appropriate direction within the bit lines 112 and word lines 114 which changes the resistance of the magnetic stacks 116.

In order to read the logic state stored in the soft layer 118 of the magnetic stack 116 of a memory cell MCu, a schematic such as the one shown in FIG. 2, including a sense amplifier (SA) 230, is used. A reference voltage UR is applied to one end of the magnetic stack 116 of the memory cell MCu. The other end of the magnetic stack 116 of the memory cell MCu is coupled to a measurement resistor $R_{m1}$. The other end of the measurement resistor $R_{m1}$ is coupled to ground. The current running through the magnetic stack 116 of the memory cell MCu is equal to current $I_{cell}$. A reference circuit 232 supplies a reference current $I_{ref}$ that is run into measurement resistor $R_{m2}$. The other end of the measurement resistor $R_{m2}$ is coupled to ground, as shown.

It is desirable to improve the characteristics of integrated circuits having memory cells like magneto-resistive memory cells.

SUMMARY OF THE INVENTION

According to one embodiment of the present invention, an integrated circuit having a cell arrangement is provided, the cell arrangement including: at least one memory cell; at least one reference memory cell set to a reference memory cell state; and a bias supplier circuit configured to supply a bias condition to the reference memory cell when accessing the memory cell such that the bias condition increases the stability of the set reference memory cell state.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a flow chart of a method of operating an integrated circuit according to one embodiment of the present invention;

FIG. 6a shows a memory module according to one embodiment of the present invention; and FIG. 6b shows a memory module according to one embodiment of the present invention.

DETAILED DESCRIPTION OF ILLUSTRATIVE EMBODIMENTS

Figure 1:
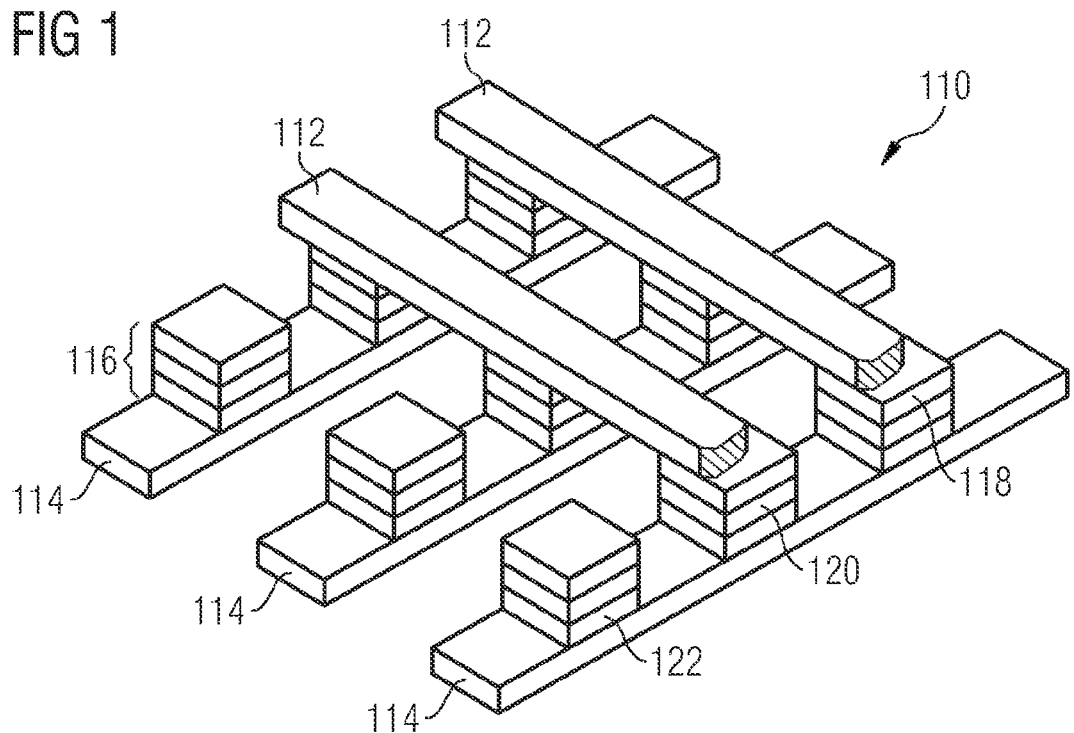
FIG. 1 shows a schematic perspective view of a magneto-resistive memory device.
Figure 2:
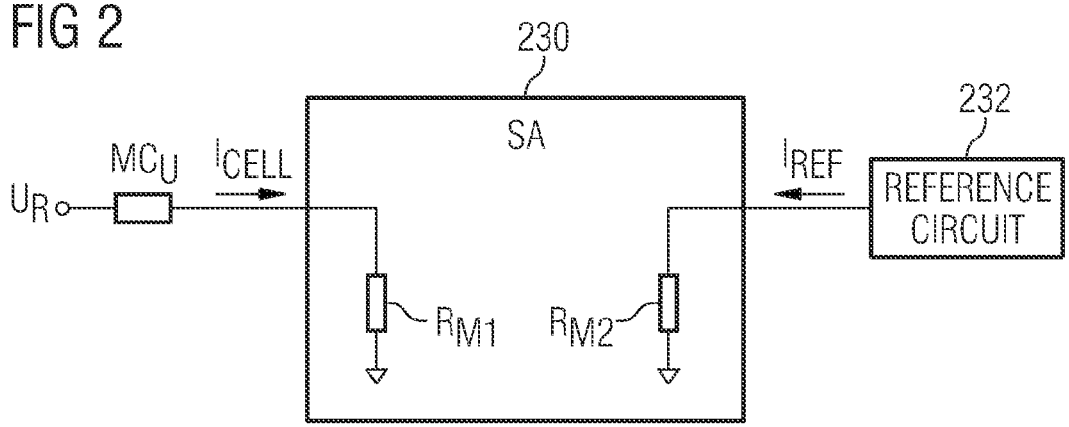
FIG. 2 shows an integrated circuit which may be used in conjunction with a magneto-resistive memory device.
Figure 3:
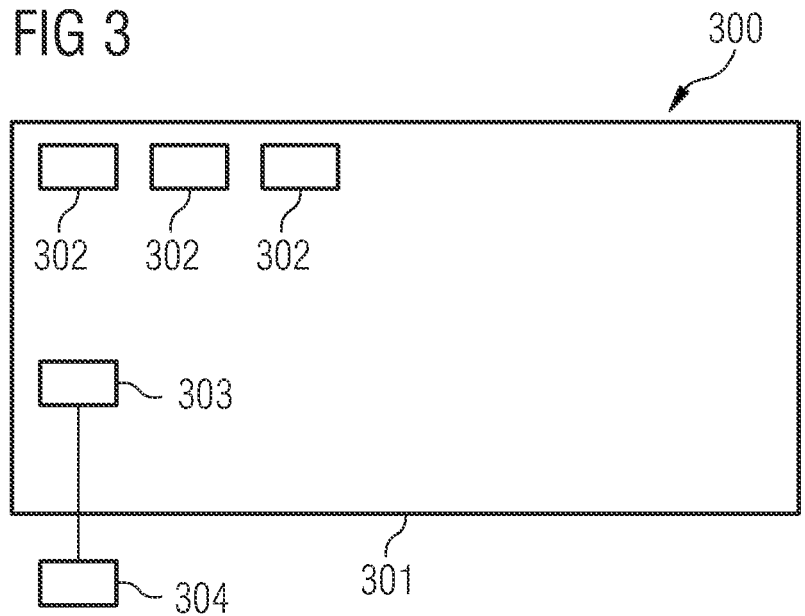
FIG. 3 shows a schematic top view of an integrated circuit according to one embodiment of the present invention.

FIG. 3 shows an integrated circuit 300 according to one embodiment of the present invention. The integrated circuit 300 includes a cell arrangement 301, the cell arrangement 301 including: at least one memory cell 302; at least one reference memory cell 303 set to a reference memory cell state; and a bias supplier circuit 304 which is capable of supplying a bias condition to the at least one reference memory cell 303 when the at least one memory cell 302 is accessed such that the bias condition increases the stability of the set reference memory cell state.

According to one embodiment of the present invention, the memory cells 302 are multi-level memory cells, i.e., each memory cell 302 is capable of adopting more than two resistance levels.

According to one embodiment of the present invention, the memory cells 302 are multi-bit memory cells, i.e., each memory cell 302 is capable of storing more than one bit of information.

According to one embodiment of the present invention, the memory cells 302 and the reference memory cells 303 are of the same type of memory cell. For example, the memory cells 302 and the reference memory cells 303 may have the same architecture.

According to one embodiment of the present invention, the memory cells 302 are magneto-resistive memory cells (for example, MRAM (magneto-resistive random access memory) cells).

According to one embodiment of the present invention, the reference memory cells 303 are magneto-resistive memory cells (for example, MRAM cells).

Figure 4:
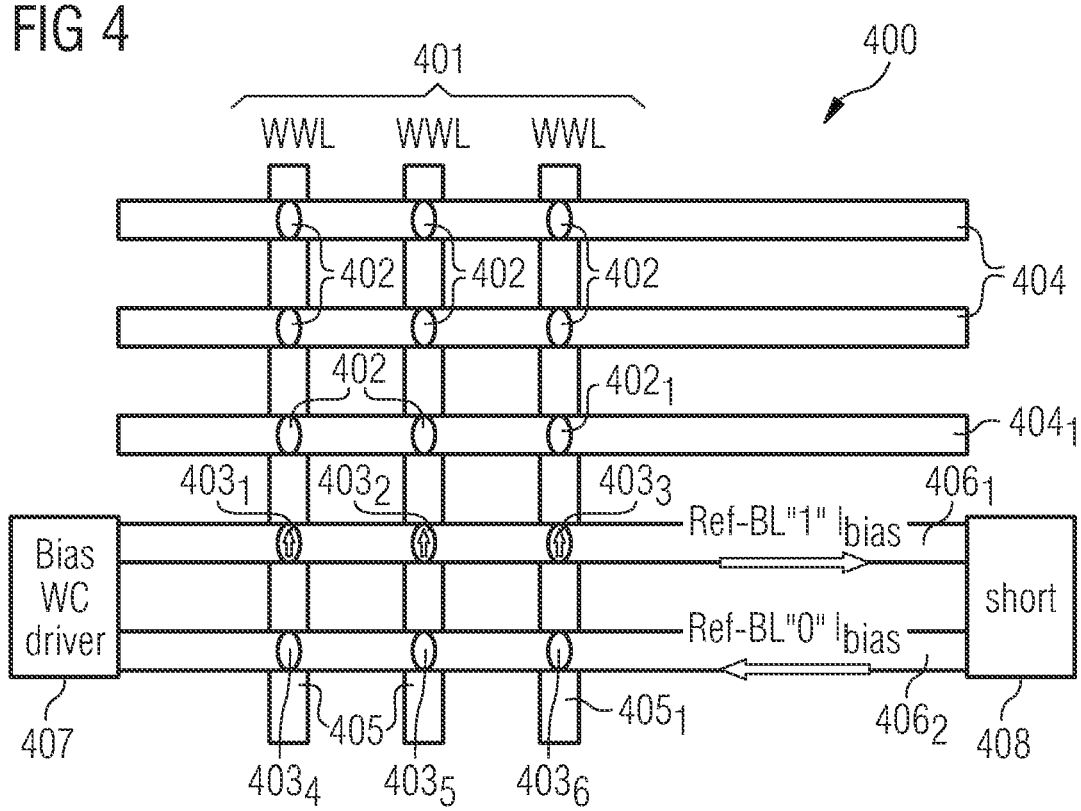
FIG. 4 shows a schematic top view of an integrated circuit according to one embodiment of the present invention.

FIG. 4 shows an integrated circuit 400 according to one embodiment of the present invention. The integrated circuit 400 includes a cell arrangement 401. The cell arrangement 401 includes memory cells 402 and reference memory cells 403, wherein the memory cells 402 and the reference memory cells 403 form a cell array having rows and columns. The memory cells 402 are disposed between memory cell bit lines 404 and write word lines 405. The reference memory cells 403 are disposed between reference memory cell bit lines 406 and the write word lines 405. The reference memory cell bit lines 406 are connected to a bias supplier circuit 407.

It is assumed here that the reference memory cells $403_1$ to $403_3$ are set to a first memory state (which may, for example, represent "1"), whereas the reference memory cells $403_4$ to $403_6$ are set to a second memory state (which may, for example, represent "0").

Let us assume that the memory cell denoted by $402_1$ is programmed to a particular memory state. In order to program the memory cell $402_1$, a current is routed through the write word line denoted by $405_1$. Further, a current is routed through the memory cell bit line denoted by $404_1$. The currents routed through the write word line $405_1$ and the memory cell bit line $404_1$ generate magnetic fields which cause the memory cell $402_1$ to adopt a particular magnetization (i.e., memory stage). However, when routing a current through the write word line $405_1$, the magnetic field caused by this current also acts on the magnetization of the reference memory cells denoted by $403_3$ and $403_6$. As a consequence, it might occur that the magnetization of the reference memory cells $403_3$ and $403_6$ is changed. A change of the magnetization of the reference memory cells $403_3$ and $403_6$, however, would result in unpredictable errors when reading out the memory states of memory cells connected to the write word line $405_1$, for example, when reading out the memory cell $402_1$.

In order to avoid this, according to one embodiment of the present invention, when routing a current (programming current) through the write word line $405_1$, the bias supplier 407 at the same time routes a bias current through the reference memory cell bit line $406_1$, wherein the magnetic field generated by the bias current stabilizes the magnetization of the reference memory cell $403_3$, thereby preventing the magnetization of the reference memory cell $403_3$ to switch when programming the memory cell $402_1$.

In order to generate a magnetic field that increases the stability of the reference memory cell state of a reference memory cell 403, a bias current may, for example, be used which causes a magnetic field that acts in the direction of the magnetization of the reference memory cell 403.

In order to generate a magnetic field that increases the stability of the reference memory cell state of a reference memory cell 403, a bias current may be used which generates a magnetic field that acts in a direction which is perpendicular to the main surface of at least one synthetic free layer of the reference memory cell 403 (usually, the main surface of at least one synthetic free layer is arranged parallel to the top surface of the memory cell bit lines 404 and write word lines 405, i.e., parallel to a plane spanned by the memory cell bit lines 404 and write word lines 405).

According to one embodiment of the present invention, the bias current used is in the range of about 0.25 mA to about 20 mA.

According to one embodiment of the present invention, the bias current is in the range of about 0.5 mA to about 10 mA.

According to one embodiment of the present invention, the bias supplier 407 is a current source.

According to one embodiment of the present invention, the programming currents routed through the write word lines 405 are in the range of about 10 mA to about 30 mA.

According to one embodiment of the present invention, the programming currents routed through the write word lines 405 are in the range of about 15 mA to about 25 mA.

According to one embodiment of the present invention, the reference memory cell bit lines $406_1$ and $406_2$ are shorted by a shortage means 408. In this way, a bias current which is routed from the bias supplier 407 to the shortage means 408 is routed back from the shortage means 408 to the bias supplier circuit 407. The change of direction of the bias current effects the magnetic field caused by the bias current within the reference memory cell bit line $406_1$ has an opposite orientation compared to the magnetic field caused by the bias current within the reference memory cell bit line $406_2$. As a consequence, one single bias current is sufficient in order to stabilize two different magnetizations (i.e., two different memory states) of at least two different reference memory cells 403 at the same time. However, as already indicated, the shortage means 408 may also be omitted.

An embodiment of the present invention further provides a cell arrangement, including: at least one memory cell; at least one reference memory cell set to a reference memory cell state; and a bias supplier to supply a bias condition to the reference memory cell when accessing the memory cell, wherein the bias condition increases the stability of the set reference memory cell state.

An embodiment of the present invention further provides a method of manufacturing an integrated circuit having a cell arrangement, the method including: forming at least one memory cell; forming at least one reference memory cell set to a reference memory cell state; and forming a bias supplier circuit to supply a bias condition to the reference memory cell when accessing the memory cell, wherein the bias condition increases the stability of the set reference memory cell state.

FIG. 5 shows a method 500 of operating an integrated circuit according to one embodiment of the present invention.

At 501, at least one memory cell is accessed.

At 502, when accessing the at least one memory cell, at least one reference cell set to a reference memory cell state is biased such that the stability of the set reference memory cell state is increased.

According to one embodiment of the present invention, the method 500 is carried out using a memory cell and a reference memory cell which are of the same type of memory cell.

According to one embodiment of the present invention, the method 500 is carried out using a memory cell being a magneto-resistive memory cell.

According to one embodiment of the present invention, the method 500 is carried out using a reference memory cell being a magneto-resistive reference memory cell.

According to one embodiment of the present invention, when carrying out the method 500, the at least one memory cell is programmed by providing a programming current to the at least one memory cell.

According to one embodiment of the present invention, the method 500 is carried out using a programming current falling within the range of about 10 mA to about 25 mA.

According to one embodiment of the present invention, when carrying out the method 500, the at least one reference memory cell is biased by providing a bias current to the at least one reference memory cell.

According to one embodiment of the present invention, the method 500 is carried out using a bias current which generates a magnetic field that increases the stability of the set reference memory cell state.

According to one embodiment of the present invention, the method 500 is carried out using a bias current which generates a magnetic field that acts in the direction of a magnetization of the reference memory cell representing the reference memory cell state.

According to one embodiment of the present invention, the method 500 is carried out using a bias current which generates a magnetic field that acts in a direction that is perpendicular to the main surface of at least one synthetic free layer of the magnetoresistive reference memory cell.

According to one embodiment of the present invention, the method 500 is carried out using a bias current falling within the range of about 0.25 mA to about 20 mA.

According to one embodiment of the present invention, the method 500 is carried out using a bias current falling within the range of about 0.5 mA to about 10 mA.

As shown in FIGS. 6A and 6B, in some embodiments, integrated circuits such as those described herein may be used in modules. In FIG. 6A, a memory module 600 is shown, on which one or more integrated circuits 604 are arranged on a substrate 602. The integrated circuits 604 include numerous memory cells. The memory module 600 may also include one or more electronic devices 606, which may include memory, processing circuitry, control circuitry, addressing circuitry, bus interconnection circuitry, or other circuitry or electronic devices that may be combined on a module with a memory device, such as the integrated circuits 604. Additionally, the memory module 600 includes multiple electrical connections 608, which may be used to connect the memory module 600 to other electronic components, including other modules.

As shown in FIG. 6B, in some embodiments, these modules may be stackable, to form a stack 650. For example, a stackable memory module 652 may contain one or more integrated circuits 656, arranged on a stackable substrate 654. The integrated circuits 656 contain memory cells. The stackable memory module 652 may also include one or more electronic devices 658, which may include memory, processing circuitry, control circuitry, addressing circuitry, bus interconnection circuitry, or other circuitry or electronic devices that may be combined on a module with a memory device, such as the integrated circuits 656. Electrical connections 660 are used to connect the stackable memory module 652 with other modules in the stack 650, or with other electronic devices. Other modules in the stack 650 may include additional stackable memory modules, similar to the stackable memory module 652 described above, or other types of stackable modules, such as stackable processing modules, control modules, communication modules, or other modules containing electronic components.

In the following description, further aspects of embodiments of the present invention are explained.

The failure of a MRAM reference cell due to half select may lead to a complete (non-repairable) device damage. In a design scheme using a line pattern for reference bit lines, the failure can be avoided by the application of a small bias current into the reference bit lines. This increases the stability of the reference cells during writing.

This problem can also be addressed for cell arrays without error correction by using a very high AQF (Array Quality Factor) cell arrays.

According to one embodiment of the present invention, during write operation, the reference bitlines are biased with a small current. In a design with two reference bit lines one end of the lines can be connected, both lines are then biased by the same driver. According to one embodiment of the present invention, a bias current of about 10% of the write current is used which already improves the stability. In this way, the MRAM reference cells are stabilized by biasing their bit lines during writing.

FIG. 4 shows a MRAM 5 ADM design which uses two reference bit lines. One bit line has all junctions written into the "1" state, while the second one has all cells written to the "0" state (line pattern). The example shows the usage of a unidirectional write current driver for the generation of the bias current in the two bit lines. The second end is shorted.

According to one embodiment of the present invention, an integrated circuit having a cell arrangement is provided, the cell arrangement including: at least one memory cell; at least one reference memory cell set to a reference memory cell state; and a bias supplier circuit configured to supply a bias condition to the reference memory cell when accessing the memory cell such that the bias condition increases the stability of the set reference memory cell state.

According to one embodiment of the present invention, the bias supplier circuit is a current supplier circuit configured to supply a current as a bias condition, or a voltage supplier circuit configured to supply a voltage as a bias condition.

According to one embodiment of the present invention, the memory cell is a multi-level memory cell.

According to one embodiment of the present invention, the memory cell is a multi-bit memory cell.

According to one embodiment of the present invention, the memory cell and the reference memory cell are of the same type of memory cell.

According to one embodiment of the present invention, the memory cell is a magnetoresistive memory cell.

According to one embodiment of the present invention, the reference memory cell is a magnetoresistive reference memory cell.

According to one embodiment of the present invention, the integrated circuit includes a first line coupling the memory cell and the reference memory cell.

According to one embodiment of the present invention, the first line is configured to provide a programming current to the memory cell.

According to one embodiment of the present invention, the first line is configured to provide a magnetic field programming the memory cell.

According to one embodiment of the present invention, the programming current is in the range of about 10 mA to about 30 mA.

According to one embodiment of the present invention, the programming current is in the range of about 15 mA to about 25 mA.

According to one embodiment of the present invention, the integrated circuit further includes a second line coupling the reference memory cell.

According to one embodiment of the present invention, the second line is configured to provide a bias current to the reference memory cell, wherein the bias current increases the stability of the set reference memory cell state.

According to one embodiment of the present invention, the second line is configured to provide a bias current to the reference memory cell, wherein the bias current generates a magnetic field that increases the stability of the set reference memory cell state.

According to one embodiment of the present invention, the second line is configured to provide a bias current to the reference memory cell, wherein the bias current generates a magnetic field that acts in the direction of a magnetization of the reference memory cell representing the reference memory cell state.

According to one embodiment of the present invention, the second line is configured to provide a bias current to the reference memory cell, wherein the bias current generates a magnetic field that acts in a direction that is perpendicular to the main surface of at least one synthetic free layer of a magnetoresistive reference memory cell.

According to one embodiment of the present invention, the bias current is in the range of about 0.25 mA to about 20 mA.

According to one embodiment of the present invention, the bias current is in the range of about 0.5 mA to about 10 mA.

According to one embodiment of the present invention, the bias supplier circuit is a current source circuit.

According to one embodiment of the present invention, the integrated circuit includes a further reference memory cell set to a further reference memory cell state which is different from the reference memory cell state of the reference memory cell.

According to one embodiment of the present invention, the integrated circuit includes a third line coupling the further reference memory cell.

According to one embodiment of the present invention, the second line and the third line are electrically shorted.

According to one embodiment of the present invention, a cell arrangement is provided, including: at least one memory cell; at least one reference memory cell set to a reference memory cell state; and a bias supplier circuit configured to supply a bias condition to the reference memory cell when accessing the memory cell such that the bias condition increases the stability of the set reference memory cell state.

According to one embodiment of the present invention, a method of manufacturing an integrated circuit having a cell arrangement is provided, the method including: forming at least one memory cell; forming at least one reference memory cell set to a reference memory cell state; and forming a bias supplier circuit configured to supply a bias condition to the reference memory cell when accessing the memory cell such that the bias condition increases the stability of the set reference memory cell state.

According to one embodiment of the present invention, a method of operating an integrated circuit having a cell arrangement is provided, the method including: accessing at least one memory cell; and when accessing the at least one memory cell, biasing at least one reference memory cell set to a reference memory cell state such that the stability of the set reference memory cell state is increased.

According to one embodiment of the present invention, the memory cell and the reference memory cell are of the same type of memory cell.

According to one embodiment of the present invention, the memory cell is a magnetoresistive memory cell.

According to one embodiment of the present invention, the reference memory cell is a magnetoresistive reference memory cell.

According to one embodiment of the present invention, the programming of the at least one memory cell includes providing a programming current to the at least one memory cell.

According to one embodiment of the present invention, the programming current provides a magnetic field programming the memory cell.

According to one embodiment of the present invention, the programming current is in the range of about 10 mA to about 30 mA.

According to one embodiment of the present invention, the programming current is in the range of about 15 mA to about 25 mA.

According to one embodiment of the present invention, the biasing of the at least one reference memory cell includes providing a bias current to the at least one reference memory cell.

According to one embodiment of the present invention, the bias current generates a magnetic field that increases the stability of the set reference memory cell state.

According to one embodiment of the present invention, the bias current generates a magnetic field that acts in the direction of a magnetization of the reference memory cell representing the reference memory cell state.

According to one embodiment of the present invention, the bias current generates a magnetic field that acts in a direction that is perpendicular to the main surface of at least one synthetic free layer of a magnetoresistive reference memory cell.

According to one embodiment of the present invention, the bias current is in the range of about 0.25 mA to about 20 mA.

According to one embodiment of the present invention, the bias current is in the range of about 0.5 mA to about 10 mA.

According to one embodiment of the present invention, a memory module is provided, including: a plurality of integrated circuits, wherein at least one integrated circuit of the plurality of integrated circuits includes a cell arrangement, the cell arrangement including: at least one memory cell; at least one reference memory cell set to a reference memory cell state; and a bias supplier circuit configured to supply a bias condition to the reference memory cell when accessing the memory cell such that the bias condition increases the stability of the set reference memory cell state.

According to one embodiment of the present invention, the memory module is a stackable memory module in which at least some of the integrated circuits are stacked one above the other.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
   a memory cell;
   a reference memory cell set to a reference memory cell state; and
   a bias supplier circuit configured to supply a bias condition to the reference memory cell when accessing the memory cell, such that the bias condition increases stability of the set reference memory cell state.

2. The integrated circuit of claim 1, wherein the memory cell comprises a multi-level memory cell.

3. The integrated circuit of claim 1, wherein the memory cell comprises a multi-bit memory cell.

4. The integrated circuit of claim 1, wherein the memory cell and the reference memory cell are of the same type of memory cell.

5. The integrated circuit of claim 1, wherein the memory cell comprises a magnetoresistive memory cell.

6. The integrated circuit of claim 5, wherein the reference memory cell comprises a magnetoresistive memory cell.

7. The integrated circuit of claim 1, further comprising a first line coupled to the memory cell and the reference memory cell.

8. The integrated circuit of claim 7, wherein the first line is configured to provide a programming current to the memory cell.

9. The integrated circuit of claim 8, wherein the first line is configured to provide a magnetic field programming the memory cell.

10. The integrated circuit of claim 8, wherein the programming current is in the range of about 15 mA to about 30 mA.

11. The integrated circuit of claim 10, wherein the programming current is in the range of about 15 mA to about 25 mA.

12. The integrated circuit of claim 7, further comprising a second line coupled to the reference memory cell.

13. The integrated circuit of claim 12, wherein the second line is configured to provide a bias current to the reference memory cell, wherein the bias current increases the stability of the set reference memory cell state.

14. The integrated circuit of claim 13, wherein the second line is configured to provide a bias current to the reference memory cell, wherein the bias current generates a magnetic field that increases the stability of the set reference memory cell state.

15. The integrated circuit of claim 14, wherein the second line is configured to provide a bias current to the reference memory cell, wherein the bias current generates a magnetic field that acts in the direction of a magnetization of the reference memory cell representing the reference memory cell state.

16. The integrated circuit of claim 14, wherein the second line is configured to provide a bias current to the reference memory cell, wherein the bias current generates a magnetic field that acts in a direction that is perpendicular to a main surface of at least one synthetic free layer of a magnetoresistive reference memory cell.

17. The integrated circuit of claim 13, wherein the bias current is in the range of about 0.25 mA to about 20 mA.

18. The integrated circuit of claim 17, wherein the bias current is in the range of about 0.5 mA to about 10 mA.

19. The integrated circuit of claim 1, wherein the bias supplier circuit comprises a current source circuit.

20. The integrated circuit of claim 1, further comprising a further reference memory cell set to a further reference memory cell state that is different from the reference memory cell state of the reference memory cell.

21. The integrated circuit of claim 20, further comprising a third line coupled to the further reference memory cell.

22. The integrated circuit of claim 21, further comprising a second line coupled to the reference memory cell, wherein the second line and the third line are electrically shorted.

23. A method of manufacturing an integrated circuit, the method comprising:
   forming a memory cell and a reference memory cell;
   setting the reference memory cell to a reference memory cell state; and
   supplying a bias condition to the reference memory cell when accessing the memory cell such that the bias condition increases stability of the set reference memory cell state.

24. A method of operating an integrated circuit, the method comprising:
   accessing at least one memory cell; and
   when accessing the at least one memory cell, biasing at least one reference memory cell set to a reference memory cell state such that stability of the set reference memory cell state is increased.

* * * * *